(12) United States Patent
Lo et al.

(10) Patent No.: US 11,112,278 B2
(45) Date of Patent: Sep. 7, 2021

(54) OPTICAL ENCODER COMPRISING A WIDTH OF AT LEAST ONE OPTICAL SENSOR ARRAY CORRESPONDS TO AN INTERPOLATION PERIOD OF THE ENCODER

(71) Applicant: INDUSTRIAL TECHNOLOGY RESEARCH INSTITUTE, Hsinchu (TW)

(72) Inventors: Ying-Che Lo, Tainan (TW); Ming-Chieh Chou, Kaohsiung (TW); Yao-Hui Lee, Tainan (TW); Yi-Cheng Chen, New Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/879,312

(22) Filed: May 20, 2020

(65) Prior Publication Data

US 2021/0199474 A1 Jul. 1, 2021

(30) Foreign Application Priority Data

Dec. 31, 2019 (TW) .................... 108148533

(51) Int. Cl.
*G01D 5/244* (2006.01)
*G01D 5/347* (2006.01)
*H03M 1/06* (2006.01)

(52) U.S. Cl.
CPC ....... *G01D 5/3473* (2013.01); *G01D 5/24438* (2013.01); *H03M 1/068* (2013.01)

(58) Field of Classification Search
CPC ............. G01D 5/3473; G01D 5/34707; G01D 5/34792; G01D 5/24476; G01D 5/24428; G01D 5/24438; G01D 5/34776
(Continued)

(56) References Cited

U.S. PATENT DOCUMENTS 4,465,373 A * 8/1984 Tamaki ................. H03M 1/285
250/237 G
4,899,048 A 2/1990 Shelander
(Continued)

FOREIGN PATENT DOCUMENTS

CN 1540292 A 10/2004
CN 205027318 U 2/2016
(Continued)

OTHER PUBLICATIONS

Mohan et al. "Devising Simulink Optical Encoder Pulse Manipulation and its Evaluation" 2012 12th International Conference on Intelligent Systems Design and Applications (ISDA), Kochi, pp. 640-644. Nov. 2012.
(Continued)

*Primary Examiner* — Que Tan Le
(74) *Attorney, Agent, or Firm* — Maschoff Brennan

(57) ABSTRACT

An optical encoder includes an encoding disk and an optical detector disposed to correspond to the encoding disk. The optical detector includes a plurality of optical sensors arranged to form an optical sensor array. The optical detector is provided to receive light. The optical detector includes at least one optical sensor arranged to form at least one sensor array. The width of the sensor array corresponds to an interpolation period of the optical encoder.

20 Claims, 8 Drawing Sheets

(58) Field of Classification Search
USPC .......................... 250/231.13, 231.18, 214 R
See application file for complete search history.

(56) References Cited

U.S. PATENT DOCUMENTS

| | | | |
|---|---|---|---|
| 5,917,182 | A | 6/1999 | Ishizuka |
| 6,154,278 | A | 11/2000 | Ito et al. |
| 6,588,333 | B1 | 7/2003 | Homer et al. |
| 6,654,128 | B2 | 11/2003 | Takayama et al. |
| 6,803,560 | B1 | 10/2004 | Okumura et al. |
| 6,906,315 | B2 | 6/2005 | Tobiason |
| 7,102,123 | B2 | 9/2006 | Chin et al. |
| 7,193,204 | B2 | 3/2007 | Mitchell |
| 7,309,855 | B2 | 12/2007 | Nagasaka et al. |
| 7,391,010 | B2 | 6/2008 | Okada et al. |
| 7,439,489 | B2 | 10/2008 | Sasaki et al. |
| 7,449,678 | B2 | 11/2008 | Ito |
| 7,550,710 | B2 | 6/2009 | McAdam |
| 7,619,208 | B2 | 11/2009 | Masada et al. |
| 7,649,168 | B2 | 1/2010 | Hane et al. |
| 7,663,093 | B2 | 2/2010 | Kusano |
| 7,825,368 | B2 | 11/2010 | Kusano |
| 7,907,286 | B2 | 3/2011 | Holzapfel |
| 7,939,795 | B2 | 5/2011 | Powell |
| 7,943,897 | B2 | 5/2011 | Okada |
| 8,141,265 | B2 | 3/2012 | Ellin et al. |
| 8,148,674 | B2 | 4/2012 | Yoshida et al. |
| 8,188,420 | B2 | 5/2012 | Lee |
| 8,188,421 | B2 | 5/2012 | Hane |
| 8,193,483 | B2 | 6/2012 | Chin et al. |
| 8,212,202 | B2 | 7/2012 | Wong et al. |
| 8,311,131 | B2 | 11/2012 | Woyzichovski |
| 8,330,098 | B2 | 12/2012 | Thor et al. |
| 8,492,703 | B2 | 7/2013 | Tobiason et al. |
| 8,546,744 | B2 | 10/2013 | Yoshida et al. |
| 8,610,050 | B2 | 12/2013 | Yamamoto et al. |
| 8,637,805 | B2 | 1/2014 | Altendort et al. |
| 8,666,261 | B2 | 3/2014 | Takahashi |
| 8,674,287 | B2 | 3/2014 | Yoshida et al. |
| 8,772,705 | B2 | 7/2014 | Rai |
| 8,847,144 | B2 | 9/2014 | Soo et al. |
| 8,933,392 | B2 | 1/2015 | Harada |
| 2004/0206894 | A1 | 10/2004 | Oka et al. |
| 2005/0058352 | A1 | 3/2005 | Deliwala |
| 2012/0013279 | A1 | 1/2012 | Setbacken et al. |
| 2016/0372149 | A1 | 12/2016 | Liebezeit |

FOREIGN PATENT DOCUMENTS

| | | |
|---|---|---|
| TW | I278604 B | 4/2007 |
| TW | I403699 B | 8/2013 |
| TW | 201534871 A | 9/2015 |
| TW | I564548 B | 1/2017 |
| TW | I646311 B | 1/2019 |
| TW | I680648 B | 12/2019 |

OTHER PUBLICATIONS

Carr et al. "Optical encoder readhead chip" Proceedings—2008 2nd Electronics Systemintegration Technology Conference, ESTC; pp. 797-801; Sep. 2008.

Liang et al. "The design of composite optical encoder" 2009 9th International Conference on Electronic Measurement & Instruments, Beijing, pp. 2-642-2-645, Aug. 2009.

Hopp et al. "A novel diffractive encoding principle for absolute optical encoders" Proc. SPIE 8082, Optical Measurement Systems for Industrial Inspection VII, 80823T (May 27, 2011).

* cited by examiner

OPTICAL ENCODER COMPRISING A WIDTH OF AT LEAST ONE OPTICAL SENSOR ARRAY CORRESPONDS TO AN INTERPOLATION PERIOD OF THE ENCODER

CROSS-REFERENCE TO RELATED APPLICATIONS

This non-provisional application claims priority under 35 U.S.C. § 119(a) on Patent Application No(s). 108148533 filed in Taiwan, R.O.C. on Dec. 31, 2019, the entire contents of which are hereby incorporated by reference.

TECHNICAL FIELD

The present disclosure relates to an encoder, more particularly to an optical encoder having high resolution.

BACKGROUND

An encoder uses optical, magnetic or mechanical contact to sense a position, converts the information of position into an electrical signal, and outputs the electrical signal to a driver as a feedback signal for controlling position. The encoder can be classified into a rotary encoder or a linear encoder according to a movement mode. The rotary encoder can convert a rotational position or a rotation quantity into analog or digital electrical signal, and the rotary encoder is generally mounted on a rotary object such as a motor shaft. The linear encoder can convert a linear position or linear displacement into electrical signal in a similar manner. Nowadays, encoders are widely used in machine tools, robots and semiconductor devices as sensing modules for servo motor positioning, and the accuracy and precision of encoders would directly affect the positioning performance of mechanical device.

For an optical encoder, there is an encoding disk (grating disk) having patterned area for light to pass through. While the encoding disk is irradiated by the light source, the optical detector receives different amounts of light due to the relative movement between the optical detector and the encoding disk, and linear displacement or the rotation angle is determined according to the change of amount of received light. The resolution of an optical encoder is determined by the quantity and the pattern of the light-intransmissive and light-transmissive regions. However, there is a physical limitation on enhancement of the resolution by increasing the quantity of light-transmissive regions because overly small light-transmissive regions may cause diffraction interference.

Among the conventional optical encoders, the optical detector would be utilized with silicon-based photodiodes (PDs) to analyze light power signals since silicon-based photodiodes have good quantum efficiency and photoelectric response in the infrared wavelength range. In a high-order encoder, the silicon-based photodiode in the optical detector is divided into two groups: a group in a coding area and another group in an interpolating area. The code track (binary code or gray code) on the encoding disk blocks light from transmitting and/or allows light to pass through. According to amount of received light, we could know the PD receives light with high luminous flux or low luminous flux. This can match with logic decoding on the system end to covert the current angle. The PDs in the interpolating area can be designed according to the period of the PD with smallest coding in the coding area so as to generate a sinusoidal signal. Then, the signal is interpolated to obtain total bits of the encoder. The total bits of encoder is a result of superposition of the resolutions of coding area and interpolating area. The conventional method of analyzing the interpolating area is to convert an analog sinusoidal signal received by PDs in the interpolating area into a digital signal through high-order analog-to-digital converter (ADC) to analyze a finer angular position. Since different ADCs is applicable to specifications of different encoders, a relatively high-order ADC is needed if it is necessary to achieve higher interpolating resolution (e.g., 24-bit/rev). For example, when the coding area provides the resolution of 10 bits, the interpolating area is required to provide the resolution of 14 bits, and thus an ADC with a resolution of at least 14 bits must be used. However, as the price of ADCs rises with resolution, the problem of increased cost arises.

SUMMARY

In view of the abovementioned problem, the present disclosure provides an optical encoder which helps to solve that high-resolution optical encoders are difficult to be widely used in related field due to high manufacturing cost of high-order ADCs.

The present disclosure provides an optical encoder including an encoding disk and an optical detector that are disposed corresponding to each other. The optical detector is configured to receive light. The optical detector includes at least one optical sensor arranged to form at least one optical sensor array. The width of the optical sensor array corresponds to an interpolation period of the optical encoder.

According to one aspect of the present disclosure, an optical encoder includes an encoding disk, an optical detector and a sensing circuit. The optical detector is configured to receive light and is disposed to correspond to the encoding disk. The optical detector includes a plurality of optical sensors arranged to form a plurality of optical sensor arrays. Each of the optical sensors has digital grayscale characteristics, and amount of light received by the optical sensors is quantified.

According to the optical encoder discussed above, the optical encoder includes optical sensors such as CMOS or CCD which can achieve high-density element arrangement and can be integrated. Taking CMOSs as an example, they can form an optical sensor array to receive light signals. Compared with the conventional optical encoder equipped with silicon-based photodiodes, CMOSs can be highly integrated into a circuit and can easily achieve high SNR, and CMOS can be manufactured by skilled manufacturing process. With the improvement of manufacturing process in recent years, the response rate of CMOS in non-visible spectrum also raises to the level of silicon-based photodiodes. Therefore, a high-resolution optical encoder equipped with CMOS optical sensors could be competitive in market.

In addition, the optical encoder may further include a sensing circuit. The sensing circuit is electrically connected to the optical sensor arrays such that the optical sensor has digital grayscale characteristics, and amount of light received by each optical sensor can be quantified so as to output electrical signals obtained according to light power signals superposed by the optical sensor arrays. Compared with the conventional silicon-based photodiode that receives analog electrical signals and then converts them into digital signals through the ADC, although the optical sensor of the present disclosure still generates electrical signals of analog signals, each optical sensor, each row of optical sensors, or each column of optical sensors can be utilized with an ADC element by designing the integrated circuit. Or alternatively, it can be simplified to take each row or each column as a standard. By doing so, when the corresponding optical sensors in the row or column are scanning in a manner of circuit scanning, the optical sensors in each row or each column can be utilized with an ADC element which captures analog signals and then converts them into digital signals. That is, the ADC converts analog signals, generated by corresponding optical sensor, into digital signals sequentially, and the superposition of these digital signals is implemented in a power amp counting circuit to obtain a full-digitalized power result. The advantage of scanning in each row or column is favorable for simplifying the quantity of ADCs.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
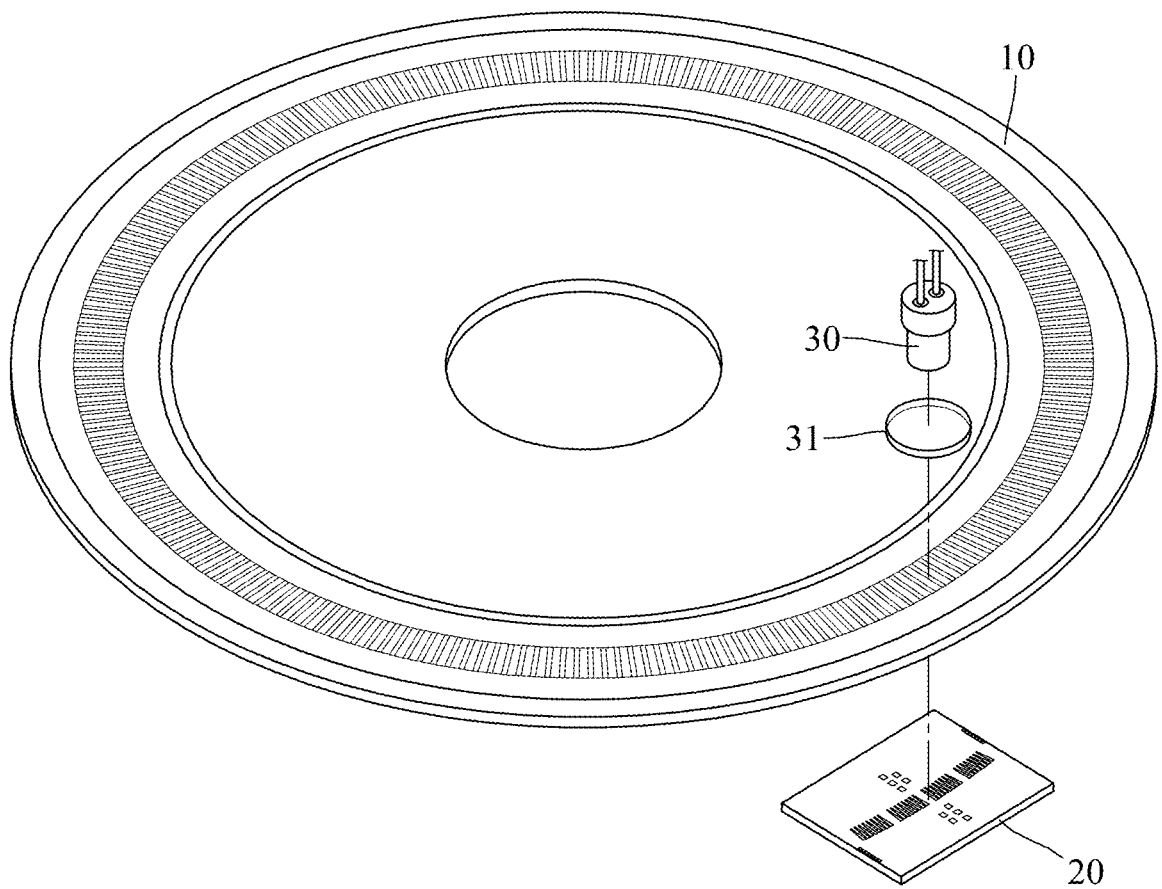
FIG. 1 is a schematic view of an optical encoder according to the first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
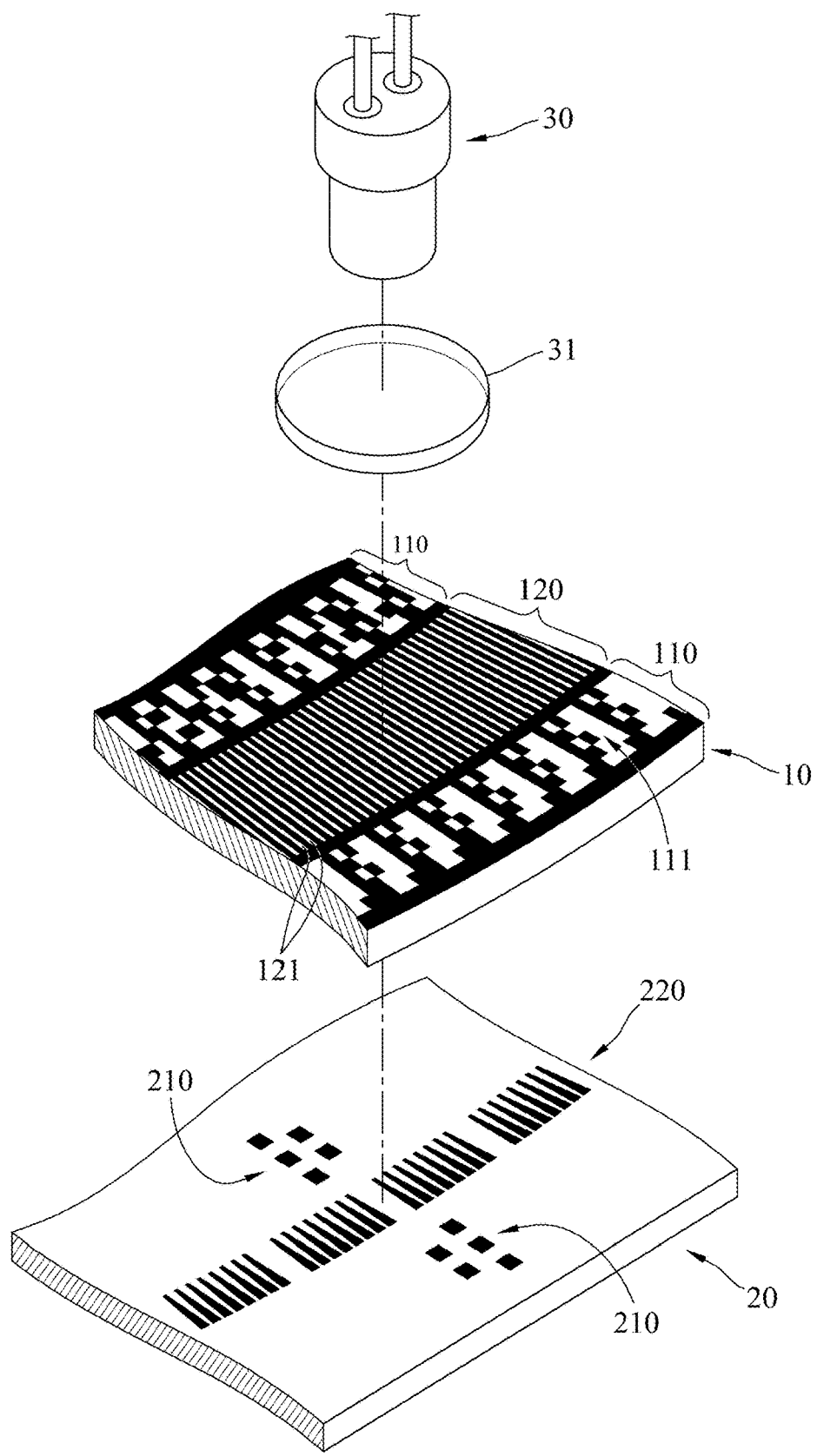
FIG. 2 is a partially enlarged view of the optical encoder in FIG. 1.
Figure 3:
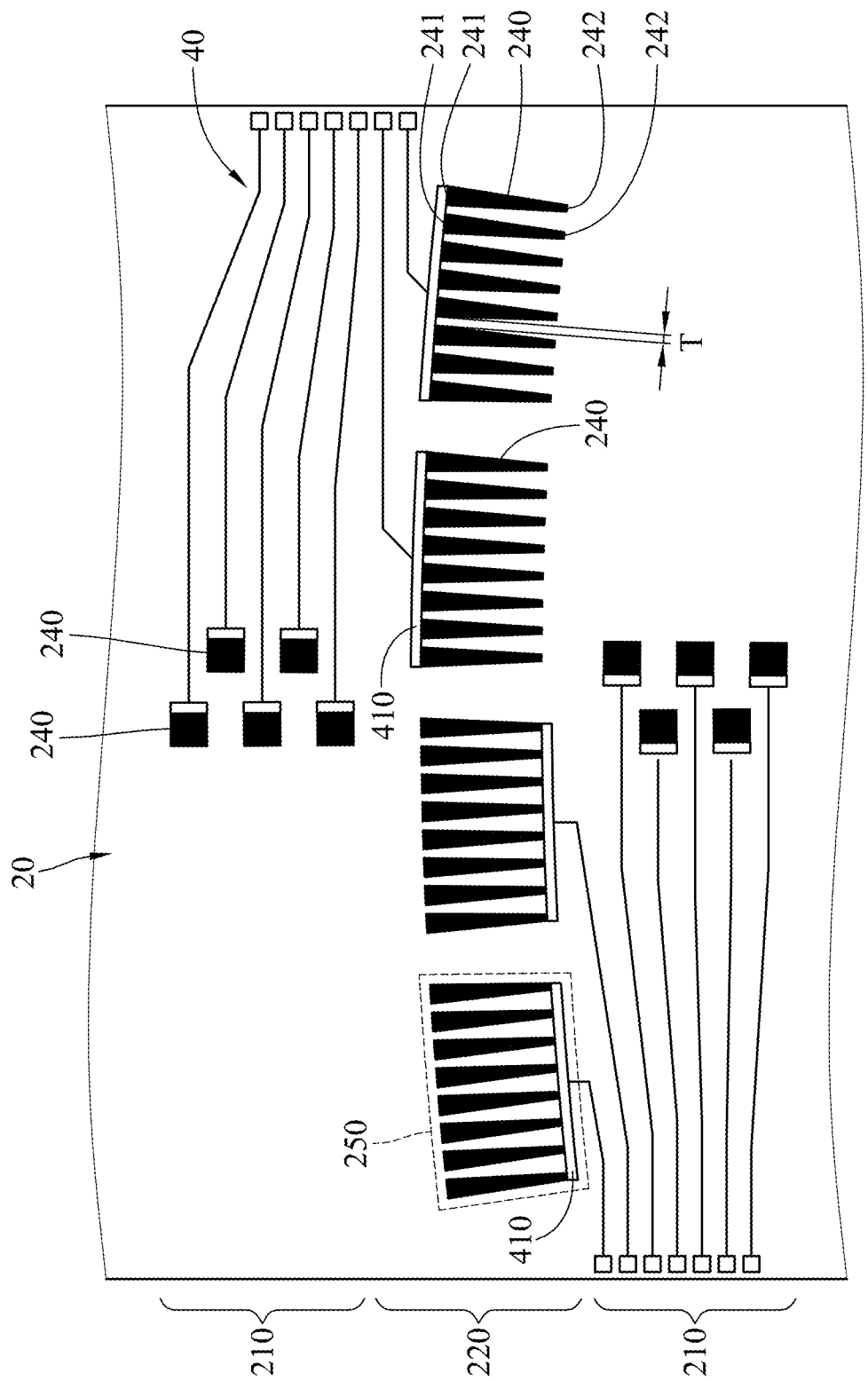
FIG. 3 is a partially enlarged view of an optical detector of the optical encoder in FIG. 2.
Figure 4:
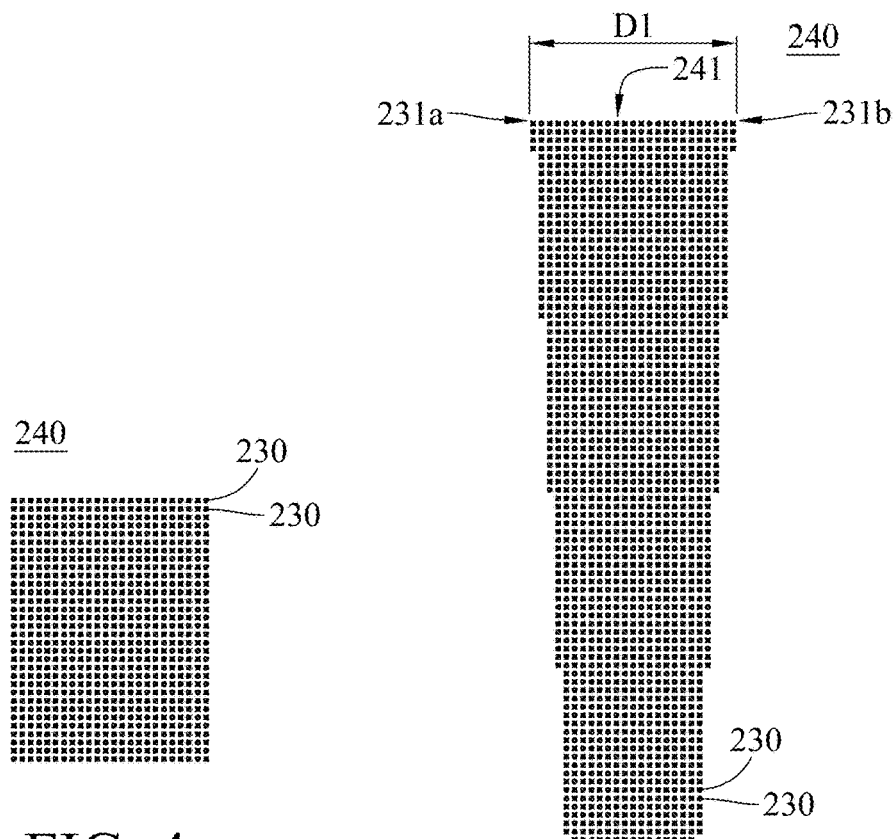
FIG. 4 is a schematic view of an optical sensor array located in an encoding light sensing part of the optical detector in FIG. 3.
Figure 5:
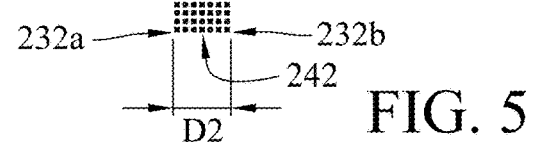
FIG. 5 is a schematic view of an optical sensor array located in an interpolating light sensing part of the optical detector in FIG. 3.

According to one embodiment of the present disclosure, an optical encoder includes an encoding disk and an optical detector. Please refer to FIG. 1 to FIG. 5, where FIG. 1 is a schematic view of an optical encoder according to the first embodiment of the present disclosure, FIG. 2 is a partially enlarged view of the optical encoder in FIG. 1, FIG. 3 is a partially enlarged view of an optical detector of the optical encoder in FIG. 2, FIG. 4 is a schematic view of an optical sensor array located in an encoding light sensing part of the optical detector in FIG. 3, and FIG. 5 is a schematic view of an optical sensor array located in an interpolating light sensing part of the optical detector in FIG. 3. In this embodiment, an optical encoder 1 includes an encoding disk 10, an optical detector 20 and a light source 30. The optical encoder 1 shown in FIG. 1 is a rotary encoder, but it may be a linear encoder in some other embodiments.

The encoding disk 10 includes two encoding code track parts 110 and an interpolating code track part 120. For simplicity drawings, the encoding code track parts 110 and the interpolating code track part 120 are not shown in FIG. 1. The encoding code track part 110 includes encoding tracks which have a plurality of opening patterns 111 configured for light passing through. The encoding method of the encoding code track part 110 may be, for example, gray code, binary code, M-sequence or other encoding method applicable to an absolute encoder. The interpolating code track part 120 is located between the two encoding code track parts 110, and the interpolating code track part 120 has a plurality of slits 121 that are spaced apart from one another and configured for light passing through. The quantity of the encoding code track parts 110 is not intended to limit the present disclosure. In addition, the positions of the encoding code track parts 110 and the interpolating code track part 120 shown in FIG. 2 are not intended to limit the present disclosure. In some embodiments, an encoding code track part is located between two interpolating code track parts; or alternatively, an encoding code track part is aligned with an interpolating code track part.

The optical detector 20 is disposed to correspond to the encoding disk 10. The optical detector 20 includes two encoding light sensing parts 210 corresponding to the encoding code track parts 110, respectively, and an interpolating light sensing part 220 corresponding to the interpolating code track part 120. The optical detector 20 further includes a plurality of optical sensors 230. Some optical sensors 230 are located in the encoding light sensing parts 210 and configured to receive light passing through the opening patterns 111 of the encoding code track parts 110. Some other optical sensors 230 are located in the interpolating light sensing part 220 and configured to receive light passing through the slits 121 of the interpolating code track part 120. In the interpolating light sensing part 220, the optical sensors 230 are arranged to form a plurality of optical sensor arrays 240. In this embodiment, each of the optical sensors 230 is, for example, a complementary metal-oxide-semiconductor (CMOS) or charge-coupled device (CCD). The CMOSs worked as the optical sensors 230 can be highly integrated into a circuit and can easily achieve high signal-to-noise ratio (SNR), which is a skilled manufacturing process and thus the manufacturing cost of the optical detector 20 can be reduced. For easy understanding the figures, only the optical sensor arrays 240 are shown whereas the optical sensors 230 are not shown in FIG. 2 and FIG. 3. The quantities of the optical sensors 230 and the optical sensor arrays 240 are not intended to limit the present disclosure.

The light source 30 disposed opposite to the encoding disk 10, and the optical detector 20 and the light source 30 are respectively located at opposite sides of the encoding disk 10, but the present disclosure is not limited to the aforementioned arrangement. In some embodiments, the optical detector 20 and the light source 30 may be located at the same side of the encoding disk 10. The light source 30 is, for example but not limited to, a light-emitting diode or a laser diode. Light emitted from the light source 30 passes through the opening patterns 111 of the encoding code track parts 110 and the slits 121 of the interpolating code track part 120 and can be received by the optical sensors 230 of the optical detector 20. Further, the optical sensors 230 can receive light within infrared wavelength range from 760 nm to 1000 nm, but the aforementioned wavelength range are not intended to limit the present disclosure. In addition, there can be one or more optical lenses 31 disposed in front of the light source 30, such that an approximately parallel light field is generated when light passes through the optical lens 31.

According to one embodiment of the present disclosure, the optical sensor arrays may be in a shape of non-rectangular. That is, the optical sensor arrays may be in polygon shapes such as trapezoid shapes, rhombus shapes and parallelogram shapes, or fan shapes, ellipse shapes or other irregular shapes. Please refer to FIG. 3 to FIG. 5, in this embodiment, the optical sensor arrays 240 located in the interpolating light sensing part 220 are in trapezoid shapes. As shown in FIG. 5, one of the optical sensor arrays 240 located in the interpolating light sensing part 220 has an upper row and a lower row, the upper row includes more optical sensors 230, and the lower row includes less optical sensors 230. The upper row can be considered as the long base 241 of the trapezoid-shaped optical sensor array 240, and the lower row can be considered as the short base 242 of the trapezoid-shaped optical sensor array 240. A distance between two of the optical sensors 230 that are adjacent to each other in each optical sensor array 240 is smaller than the distance T between two optical sensor arrays 240 that are adjacent to each other; specifically, the distance between adjacent optical sensors 230 is smaller than the minimum distance between adjacent optical sensor arrays 240.

In this embodiment, the long base 241 of the said optical sensor array 240 is defined by the distance from the leftmost optical sensor 230 to the rightmost optical sensor 230 in the upper row, and the short base 242 is defined by the distance from the leftmost optical sensor 230 to the rightmost optical sensor 230 in the lower row. As shown in FIG. 5, the distance D1 from the left side 231*a* of the leftmost optical sensor 230 to the right side 231*b* of the rightmost optical sensor 230 in the upper row is defined as the long base 241 of the optical sensor array 240. The distance D2 from the left side 232*a* of the leftmost optical sensor 230 to the right side 232*b* of the rightmost optical sensor 230 in the lower row is defined as the short base 242 of the optical sensor array 240.

According to one embodiment of the present disclosure, theses optical sensor arrays are arranged side by side in the interpolating light sensing part. Please refer to FIG. 3 and FIG. 5, the trapezoid-shaped optical sensor arrays 240 located in the interpolating light sensing part 220 are arranged side by side. For some optical sensor arrays 240, the short bases 242 of respective optical sensor arrays 240 face the same direction, and the long bases 241 face the opposite direction. These optical sensor arrays 240 together form an optical sensor array group 250, and each optical sensor array group 250 is spaced apart from other optical sensor array groups 250.

In FIG. 3, the short bases 242 of the optical sensor arrays 240 in each optical sensor array group 250 face the same direction, but the present disclosure is not limited thereto. In some embodiments, the optical sensor arrays 240 in each optical sensor array group 250 can be arranged in a manner that the long bases 241 and the short bases 242 are alternatively arranged; that is, the short base 242 of one of the optical sensor arrays 240 and the short base 242 of adjacent one of the optical sensor arrays 240 face opposite directions.

In FIG. 5, all the optical sensors 230 in each optical sensor array 240 are square-shaped, and thus the trapezoid-shaped optical sensor array 240 has zigzag edges, but the present disclosure is not limited thereto. In some embodiments, for one optical sensor array 240, the optical sensors 230 on the outermost side of the optical sensor array 240 may be trapezoid-shaped or polygon-shaped to smoothen the contour of the optical sensor array 240 from having zigzag edges.

Light emitted from the light source 30 passes through the encoding code track parts 110 and the interpolating code track part 120 to respectively reach the optical sensors 230 located in the encoding light sensing parts 210 and the optical sensors 230 located in the interpolating light sensing part 220, and the optical sensors 230 receive light to output electrical signals. Herein, one optical sensor 230 receives an analog electrical signal that related to the change of light intensity and outputs a digital signal via an analog-to-digital converter (ADC) or a comparator connected thereto. When the encoding disk 10 moves relative to the optical detector 20 or the optical detector 20 moves relative to the encoding disk 10, the quantity of the optical sensors 230 that can receive light changes. As such, the digital signals converted by the optical encoder 1 changes, and the amount of displacement or rotation angle is determined according to the change of the digital signals.

The optical sensor arrays 240 shown in FIG. 3 and FIG. 5 are not intended to limit the present disclosure. In some embodiments, the interpolating code track part of the encoding disk can be designed to includes non-rectangular slits corresponding to rectangular optical sensor arrays. Alternatively, the slits of the interpolating code track part and the optical sensor arrays may be both rectangular so as to work with a light source of a non-parallel light field. An embodiment of non-parallel light field can be a reflective encoder including a light source and an optical detector that are located on the same side thereof.

Figure 6:
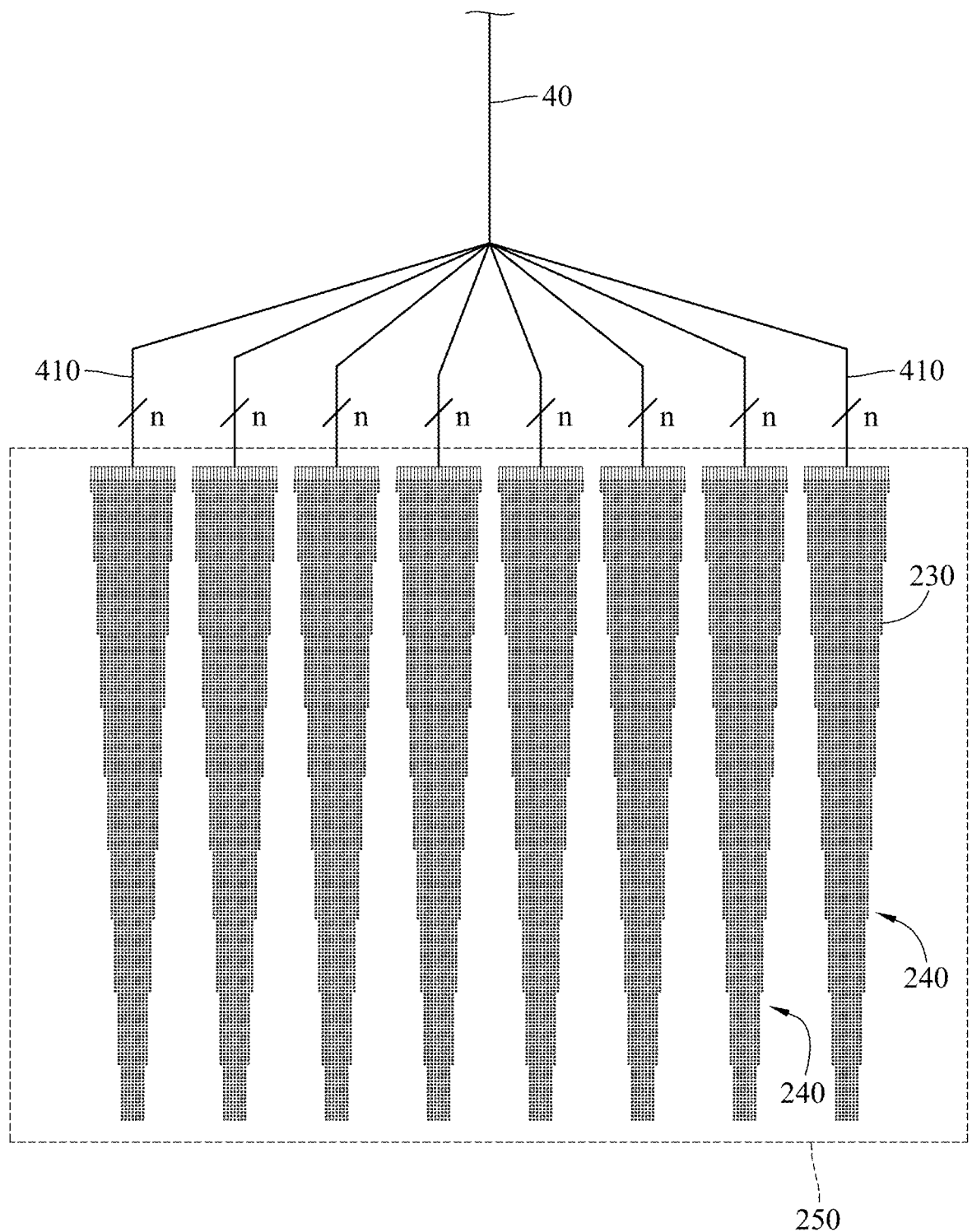
FIG. 6 is a schematic view of optical sensor arrays and a sensing circuit of an optical encoder according to the first embodiment of the present disclosure.

According to one embodiment of the present disclosure, the optical sensors have digital grayscale characteristics, and amount of light received by the optical sensors can be quantified. The quantification of the optical sensors can be accomplished by electrical connection between optical sensor and ADC. According to the present disclosure, multiple ADCs are electrically connected to at least one optical sensor of respective optical sensor arrays. Please further refer to FIG. 6, which is a schematic view of optical sensor arrays and a sensing circuit of an optical encoder according to the first embodiment of the present disclosure. As shown in FIG. 1 and FIG. 3, in this embodiment, the optical encoder 1 further includes a sensing circuit 40 disposed on the optical detector 20. As shown in FIG. 6, the sensing circuit 40 includes a plurality of simultaneous-sampling ADCs 410, and the optical sensors 230 in each column are electrically connected to one of the simultaneous-sampling ADCs 410. For one of the optical sensor arrays 240, the optical sensors 230 are arranged in columns, and the optical sensors 230 in each column are electrically connected to one of the simultaneous-sampling ADCs 410. The ADC 410 can sequentially read power of each optical sensor 230 in corresponding column in a manner of scanning and converts analog signals into digital signals. If there are N columns of the optical sensors 230 in one optical sensor array 240, N simultaneous-sampling ADCs 410 are provided to be electrically connected to respective N columns of the optical sensors 230.

For one of the optical sensor array groups 250, the simultaneous-sampling ADCs 410 in each optical sensor array 240 are electrically connected to respective columns of the optical sensors 230, and the simultaneous-sampling ADCs 410 in the optical sensor arrays 240 are connected in parallel so as to output electrical signals according to light power signals superposed by the optical sensor arrays 240. As such, the electrical signals generated by the optical sensors 230 can indicate not only whether amount of light is received, but also the amount of power of received light, such that it is considered that the optical sensors have grayscale digital characteristics. The optical sensors 230 of each column in this embodiment are exemplarily electrically connected to one of the simultaneous-sampling ADCs 410, but the present disclosure is not limited thereto. In some embodiments, the optical sensors of each row may be electrically connected to one of ADCs. Or alternatively, each optical sensor corresponds to one ADC or one comparator; that is, the comparator can be used instead of the simultaneous-sampling ADC 410.

Similarly, the sensing circuit 40 can further include a simultaneous-sampling ADC or a comparator circuit that is electrically connected to the optical sensors 230 in the encoding light sensing parts 210, such that amount of light received by the optical sensors 230 in the encoding light sensing parts 210 can be quantified.

In summary, each optical sensor array 240 is formed by arranging the optical sensors 230, and each optical sensor 230 can be connected to the sensing circuit (ADC or comparator). By superposition of the digital signals from the optical sensors 230, the purpose of increasing resolution can be easily achieved.

For a conventional optical encoder using silicon-based photodiodes, a single silicon-based photodiode is connected to a high-order sensing circuit (e.g., an ADC with a resolution of 10 bits or more) to achieve high resolution. In some embodiments of the present disclosure, the optical sensors 230 may be CMOS optical sensors. Since CMOS belongs to skilled integrated circuit process, in the case that the optical sensor array 240 has the same sensing area as the silicon-based photodiode, the optical sensors 230 of the optical sensor array 240 can be connected to a middle-order sensing circuit (e.g., an ADC with a resolution of 5-10 bits) or a low-order sensing circuit (e.g., a comparator), and the manufacturing cost of the sensing circuit can be reduced while signal-to-noise ratio (SNR) in the integrated circuit process is improved.

Figure 7:
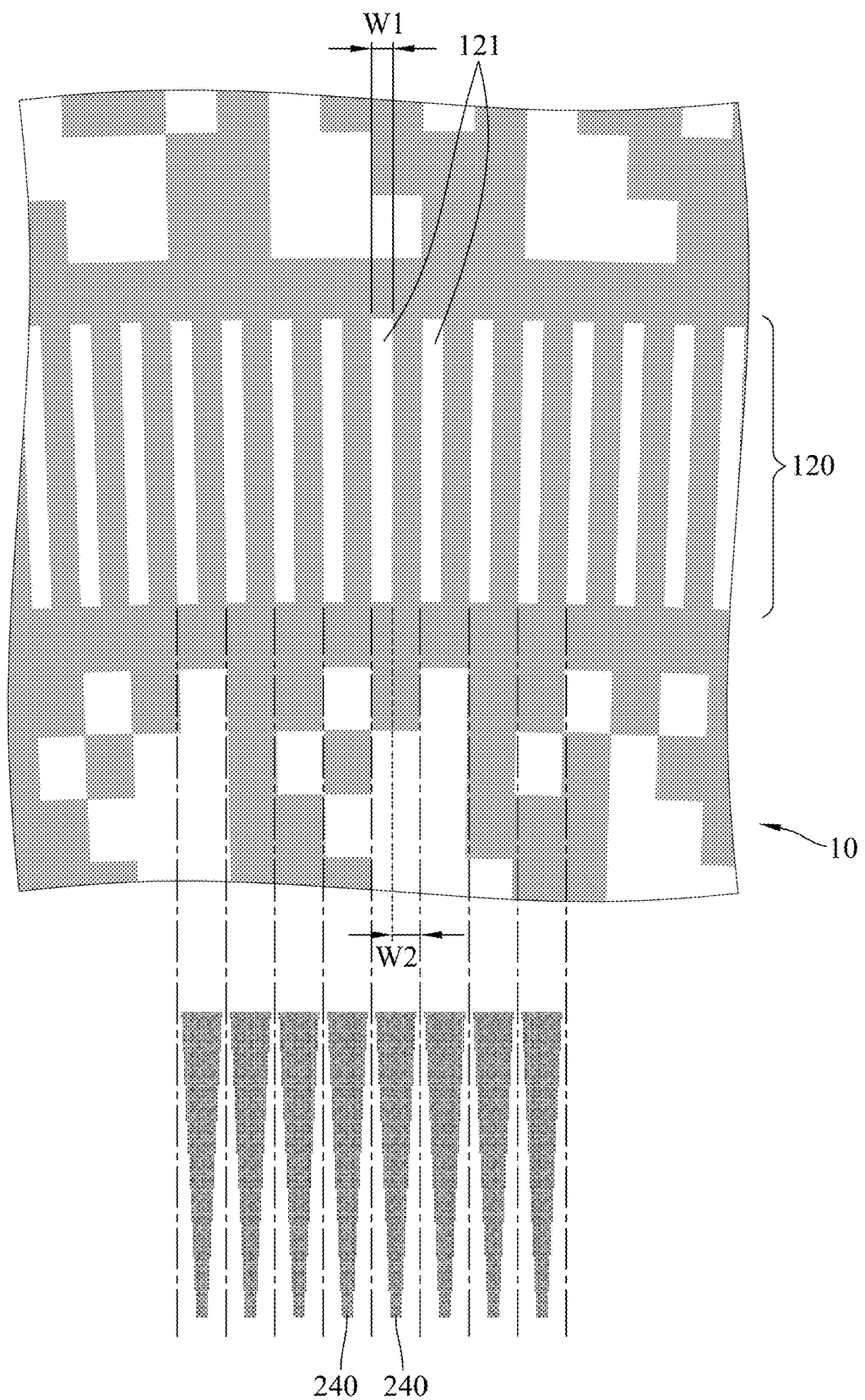
FIG. 7 is a schematic view of an interpolation period of the optical encoder in FIG. 6.

Please refer to FIG. 7, which is a schematic view of an interpolation period of the optical encoder in FIG. 6. The optical resolution of the encoding disk 10 depends on the widths of the slits 121 and the distances between adjacent slits 121 in the interpolating code track part 120. Herein, in the encoding disk 10, one slit 121 has a width W1, a light-intransmissive area between adjacent slits 121 has a width W2, and the sum of the width of the slit 121 and the width of the light-intransmissive area (W1+W2) is defined as an interpolation period of the interpolating light sensing part of the optical encoder, also called the smallest encoding bit of the encoding light sensing part. Please refer to FIG. 5 to FIG. 7, each optical sensor array 240 has a width (distance D1) corresponding to an interpolation period. Specifically, the maximum width (distance D1) of the optical sensor array 240 is smaller than or equal to the size of an interpolation period. In some embodiments, the sum of the width of one optical sensor array 240 and the distance T (please refer to FIG. 3 again) between adjacent optical sensor arrays 240 is equal to an interpolation period.

According to the resolution of the encoding disk, the size of the optical sensor array would be adjusted. Please refer to FIG. 8, which is a partially enlarged view of an optical detector of an optical encoder according to the second embodiment of the present disclosure. In this embodiment, the optical detector of the optical encoder includes an encoding light sensing part 210 and an interpolating light sensing part 220. An optical sensor array 240a including optical sensors 230 is located in the encoding light sensing part 210, and an optical sensor array 240b including optical sensors 230 is located in the interpolating light sensing part 220. The optical resolution of the encoding disk in this embodiment is higher than that of the encoding disk in the first embodiment; that is, an interpolation period of this embodiment is relatively small. In order to match the width of the optical sensor array 240b with an interpolation period, the optical sensor array 240b in the interpolating light sensing part 220 is formed by four optical sensors 230, and the optical sensor array 240a in the encoding light sensing part 210 is formed by sixteen optical sensors 230. The optical sensor array 240b provided in this embodiment is rectangular, and each optical sensor 230 in the optical sensor array 240b can be electrically connected to an ADC such that the optical sensors have digital grayscale characteristics.

Figure 9:
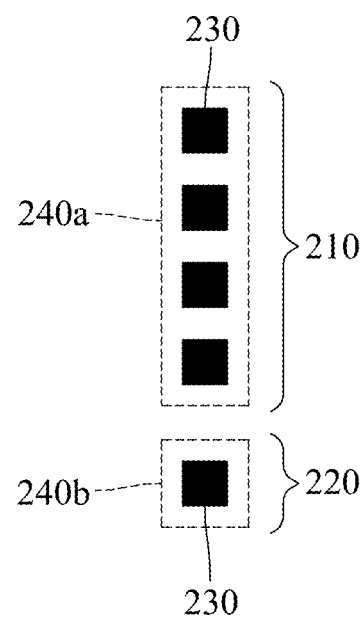
FIG. 9 is a partially enlarged view of an optical detector of an optical encoder according to the third embodiment of the present disclosure.

Please refer to FIG. 9, which is a partially enlarged view of an optical detector of an optical encoder according to the third embodiment of the present disclosure. The optical resolution of the encoding disk in this embodiment is higher than that of the encoding disk in the second embodiment; that is, an interpolation period of this embodiment is further relatively small. In order to match the width of the optical sensor array 240b with an interpolation period, the optical sensor array 240b in the interpolating light sensing part 220 is formed by one optical sensor 230, and the optical sensor array 240a in the encoding light sensing part 210 is formed by four optical sensors 230.

Figure 8:
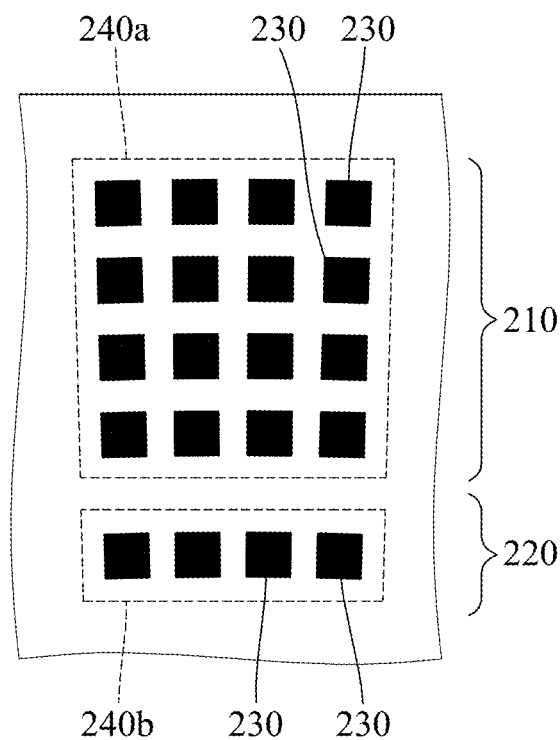
FIG. 8 is a partially enlarged view of an optical detector of an optical encoder according to the second embodiment of the present disclosure.

FIG. 8 and FIG. 9 illustrate one optical sensor array 240b in the interpolating light sensing part 220. Actually, there may be a plurality of optical sensor arrays 240b in the interpolating light sensing part 220, and the optical sensor arrays 240b can be connected in parallel to increase resolution.

Hereinafter, other designs of the optical encoders in the present disclosure would be further described in specific embodiments.

Embodiment I

Embodiment I provides a rotary optical encoder 1 as shown in FIG. 1 to FIG. 6, and the rotary optical encoder 1 includes an encoding disk 10, an optical detector 20, a light source 30 and a sensing circuit 40. An interpolating code track part 120 of the encoding disk 10 has a plurality of slits 121 that are spaced apart from one another and configured for light passing through. The width of the slits 121 may be 60 micrometers (μm), and the total quantity of the slits 121 is 1024. The specific widths and the quantity of the slits are only exemplary, and they would vary based on the resolution requirement of the interpolating code track part 120.

The optical detector 20 includes a plurality of optical sensors 230 located in the encoding light sensing parts 210 and an interpolating light sensing part 220. The optical sensors 230 located in the interpolating light sensing part 220 are arranged to form a plurality of trapezoid-shaped optical sensor arrays 240, and adjacent eight optical sensor arrays 240 together form an optical sensor array group 250. Each optical sensor array 240 includes 2960 optical sensors 230 that are arranged in 25 columns (n=25). The lowermost row of one optical sensor array 240 includes 7 optical sensors 230, and the uppermost row thereof includes 25 optical sensors 230. The long base 241 (distance D1) of one optical sensor array 240 is 121.25 µm, and the short base 242 (distance D2) thereof is 33.95 µm.

The light source 30 can emit infrared light with a wavelength of 850 nm. The optical sensors 230 are CMOS photodiodes which have a response rate of 0.41 amps/watt (A/W) under the emission of infrared light with a wavelength of 850 nm.

The sensing circuit 40 includes a plurality of ADCs 410. For one of the optical sensor arrays 240, there are 25 ADCs 410 electrically connected to the optical sensors 230 of respective 25 columns. In addition, in one optical sensor array group 250, the ADCs 410 in the eight optical sensor arrays 240 are connected in parallel; therefore, a total of 200 analog-to-digital converters (ADCs) 410 are connected in parallel.

Embodiment II

Embodiment II provides a rotary optical encoder 1, and the rotary optical encoder 1 includes an encoding disk 10, an optical detector 20, a light source 30 and a sensing circuit 40. An interpolating code track part 120 of the encoding disk 10 has a plurality of slits 121 that are spaced from one another and configured for light passing through. The total quantity of the slits 121 is 1024.

The optical detector 20 includes a plurality of optical sensors 230 located in encoding light sensing parts 210 and an interpolating light sensing part 220. The optical sensors 230 located in the interpolating light sensing part 220 are arranged to form a plurality of trapezoid-shaped optical sensor arrays 240, and adjacent eight optical sensor arrays 240 together form an optical sensor array group 250. Each optical sensor array 240 includes 2960 optical sensors 230 that are arranged in 25 columns. The lowermost row of one optical sensor array 240 includes 7 optical sensors 230, and the uppermost row thereof includes 25 optical sensors 230. The long base 241 of one optical sensor array 240 is 121.25 µm, and the short base 242 thereof is 33.95 µm.

The light source 30 can emit infrared light with a wavelength of 850 nm. The optical sensors 230 are CMOS photodiodes which have a response rate of 0.41 amps/watt (A/W) under the emission of infrared light with a wavelength of 850 nm.

The sensing circuit 40 includes a plurality of comparators. For one of the optical sensor arrays 240, each optical sensor 230 corresponds to one comparator, and all comparators are connected in parallel.

The difference between the Embodiment II and the Embodiment I is that the optical encoder 1 of the Embodiment II is equipped with simple comparators instead of ADCs. As such, each optical sensor 230 only provides a binary output result of 0 or 1. Then, by superposition of the signals from each optical sensor array 240, the digitalized result of the optical sensor array group 250 is obtained.

[Resolution of Optical Encoder]

In the Embodiments I and II, the encoding disk 10 having 1024 slits 121 provides 10-bit resolution. When the quantity of the optical sensors 230 in each optical sensor array 240 is 2960, and a total of eight optical sensor arrays 240 are connected in parallel, a circuit design of pair of differential analog signals Sin+ and Sin− can be used to double the resolution. Therefore, the total quantity of the optical sensors can reach 2960×8 (units)×2 (areas)=47360 optical sensors. If each optical sensor is connected to one comparator and has independent output result of 0 or 1, the resolution is approximately 15 bits (the quantity is larger than 32768), and the optical encoder can achieve at least 25-bit/rev. resolution. If each optical sensor 230 is utilized with an ADC of 10 bits grayscale instead, the optical encoder of the Embodiment I can achieve 35-bit/rev. resolution. Therefore, the optical encoder of the Embodiment I has a resolution of up to 35-bit, and the optical encoder of the Embodiment II has a resolution of 25-bit/rev.

[Design of Light Source and Optical Detector]

In the Embodiments I and II, CMOS photodiodes (optical sensors 230) have a response rate of 0.41 amps/watt under the emission of infrared light with a wavelength of 850 nm. According to an optical encoder of one comparative embodiment, CMOS optical sensors are replaced with silicon-based photodiodes which have a response rate of 0.46 amps/watt under the emission of infrared light with a wavelength of 850 nm.

Therefore, under the emission of infrared light with a wavelength of 850 nm, the optical encoder equipped with CMOS photodiodes and the conventional photodiodes equipped with silicon-based photodiodes have similar response rates.

[Design of Trapezoid-Shaped Optical Sensor Array for Compensation of Photoelectric Signal]

In the optical encoder 1 of the Embodiment I, the optical sensor arrays 240 receive an optical signal passing through the slits 121. When the encoding disk 10 or the optical detector 20 rotates, the optical detector 20 can obtain an electrical signal approximate to a sinusoidal waveform (including sine waveform and cosine waveform). However, if the optical detector 20 is not optimized in design, the waveform of this electrical signal would be in a non-standard sinusoidal waveform, or even in a non-sinusoidal waveform, which has a significant impact on the signal quality. In order to prevent deterioration of signal quality, there is a particular shape design for the trapezoid-shaped optical sensor array 240 in the Embodiment I. In Embodiment I, the optical sensor array 240 has a long base 241 approximate to 121.25 µm and a short base 242 approximate to 33.95 µm. Such trapezoid-shaped optical sensor array 240 satisfy an angular deviation of less than 1.0. The angular deviation represents the standard deviation between the output result of the analyzed angle and the ideal angle. Taking a circular encoding disk as an example, if 360 degrees of the circular encoding disk are divided into 1024 resolution, each ideal angle is approximately 0.352 degrees, and the angle deviation is used for describing the difference between the design result and the ideal angle.

When the encoding disk or the optical detector rotates, the intensity of light received by the optical sensor array groups 250 in different regions can be changed by designing the phase difference in different interpolating regions. As shown in FIG. 3, electrical signals of the four optical sensor array groups 250 represent four sinusoidal signals Sin+, Cos+, Cos−, Sin−. Two sinusoidal waves with a phase difference of 90 degrees can be obtained by differently pairing Sin+ with Sin− and Cos+ with Cos−. According to the lissajous figure obtained by superposing the two sinusoidal waves, this circular figure can be further interpolated in angle.

Figure 10:
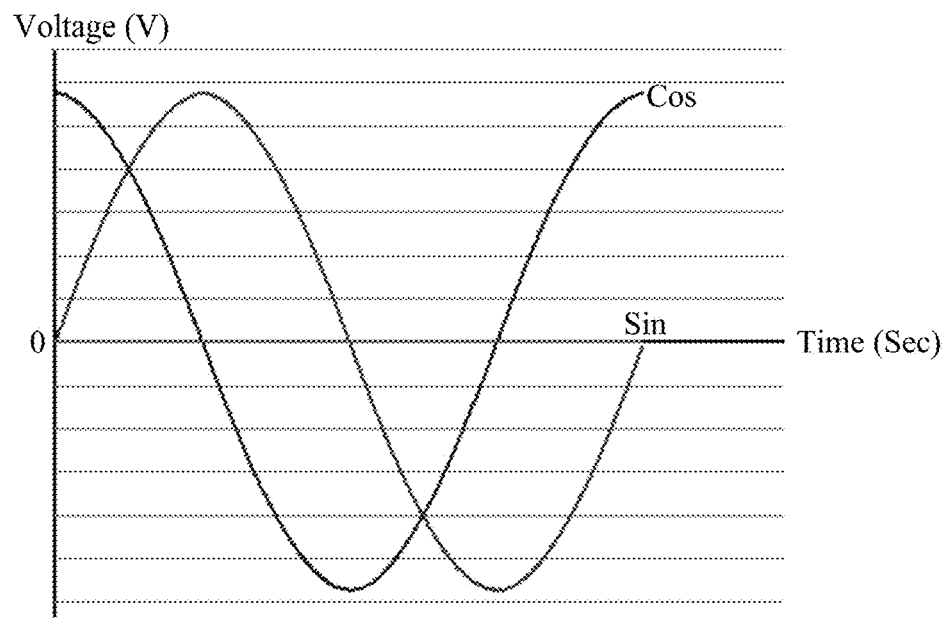
FIG. 10 is a sine wave signal and a cosine wave signal generated by an optical encoder according to one embodiment of the present disclosure.
Figure 11:
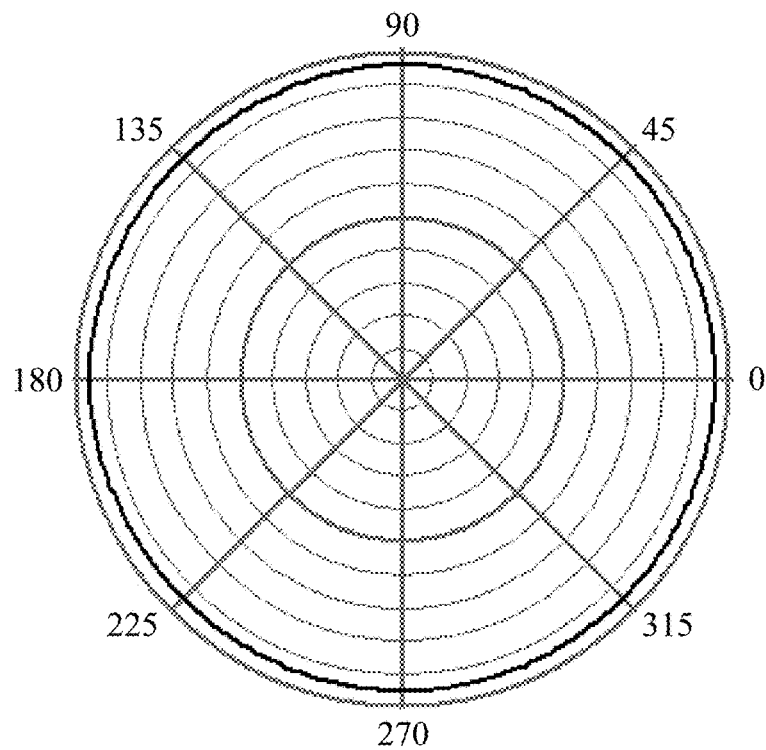
FIG. 11 is a lissajous figure obtained based on incorporating the sine wave signal and the cosine wave signal in FIG. 10.

Please refer to FIG. 10 and FIG. 11, where FIG. 10 is a sine wave signal and a cosine wave signal generated by an optical encoder according to one embodiment of the present disclosure, and FIG. 11 is a lissajous figure obtained based on incorporating the sine wave signal and the cosine wave signal in FIG. 10. It can be seen that the four optical sensor array groups 250 in the Embodiment I generates signals having phase differences of 90 degrees or its multiple from one another. By differently pairing, two sine and cosine waves can be obtained. By superposing the electrical signals, the lissajous figure approximate to a circle is obtained. This indicates that differently paired trapezoidal optical sensor arrays generate electrical signals with relatively good signal quality.

According to the present disclosure, the optical encoder includes optical sensors such as CMOS or CCD which can achieve high-density element arrangement and can be integrated. Taking CMOSs as an example, they can form an optical sensor array to receive light signals. Compared with the conventional optical encoder equipped with silicon-based photodiodes, CMOSs can be highly integrated into a circuit and can easily achieve high SNR, and CMOS can be manufactured by skilled manufacturing process. With the improvement of manufacturing process in recent years, the response rate of CMOS in non-visible spectrum also raises to the level of silicon-based photodiodes. Therefore, a high-resolution optical encoder equipped with CMOS optical sensors could be competitive in market.

In addition, the optical encoder disclosed in the present disclosure may further include a sensing circuit. The sensing circuit is electrically connected to the optical sensor arrays such that the optical sensor has digital grayscale characteristics, and amount of light received by each optical sensor can be quantified so as to output electrical signals obtained according to light power signals superposed by the optical sensor arrays. Compared with the conventional silicon-based photodiode that receives analog electrical signals and then converts them into digital signals through the ADC, although the optical sensor still generates electrical signals of analog signals, each optical sensor, each column of optical sensors, or each row of optical sensors can be utilized with an ADC element by designing the integrated circuit. By doing so, when the corresponding optical sensors in the row or column are scanning in a manner of circuit scanning, the optical sensors in each row or each column can be utilized with an ADC element which captures analog signals and then converts them into digital signals. That is, the ADC converts analog signals, generated by corresponding optical sensor, into digital signals sequentially, and the superposition of these digital signals is implemented in a power amp counting circuit to obtain a full-digitalized power result. The advantage of scanning in each row or column is favorable for simplifying the quantity of ADCs.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. An optical encoder, comprising:
   an encoding disk; and
   an optical detector, disposed to correspond to the encoding disk and configured to receive light, wherein the optical detector comprises at least one optical sensor arranged to form at least one optical sensor array, and a width of the at least one optical sensor array corresponds to an interpolation period of the optical encoder.

2. The optical encoder according to claim 1, wherein a quantity of the at least one optical sensor is plural, a quantity of the at least one optical sensor array is plural, the optical sensors are arranged to form the optical sensor arrays, and the width of each of the optical sensor arrays corresponds to the interpolation period of the optical encoder.

3. The optical encoder according to claim 2, wherein each of the optical sensors is a complementary metal-oxide-semiconductor (CMOS) optical sensor.

4. The optical encoder according to claim 2, wherein the optical sensor arrays comprise a first optical sensor array and a second optical sensor array adjacent to each other, both a distance between two of the optical sensors that are adjacent to each other in the first optical sensor array and a distance between two of the optical sensors that are adjacent to each other in the second optical sensor array are smaller than a distance between the first optical sensor array and the second optical sensor array.

5. The optical encoder according to claim 2, wherein the encoding disk comprises an encoding code track part and an interpolating code track part, the optical detector comprises an encoding light sensing part corresponding to the encoding code track part and an interpolating light sensing part corresponding to the interpolating code track part, and the optical sensor arrays are located in the interpolating light sensing part.

6. The optical encoder according to claim 5, wherein the optical sensor arrays are arranged side by side in the interpolating light sensing part.

7. The optical encoder according to claim 6, wherein each of the optical sensor arrays is in a shape of non-rectangular.

8. The optical encoder according to claim 7, wherein each of the optical sensor arrays is in a trapezoid shape, and short bases of the optical sensor arrays face the same direction.

9. The optical encoder according to claim 2, wherein each of the optical sensors has digital grayscale characteristics, and amount of light received by the optical sensors is quantified.

10. The optical encoder according to claim 9, further comprises a sensing circuit, wherein the sensing circuit comprises a plurality of analog-to-digital converters (ADCs), and the plurality of ADCs are electrically connected to at least one optical sensor of respective optical sensor arrays.

11. The optical encoder according to claim 9, further comprises a sensing circuit, wherein the sensing circuit comprises a plurality of comparators, and the plurality of comparators are electrically connected to each optical sensor of respective optical sensor arrays.

12. The optical encoder according to claim 3, wherein each of the optical sensors is configured to receive light in an infrared wavelength range.

13. An optical encoder, comprising:
    an encoding disk;
    an optical detector, disposed to correspond to the encoding disk and configured to receive light, wherein the optical detector comprises a plurality of optical sensors arranged to form a plurality of optical sensor arrays; and
    a sensing circuit, electrically connected to the plurality of optical sensor arrays, each of the plurality of optical sensors has digital grayscale characteristics, and amount of light received by the plurality of optical sensors is quantified.

14. The optical encoder according to claim 13, wherein each of the plurality of optical sensors is a CMOS optical sensor.

15. The optical encoder according to claim 13, wherein the sensing circuit comprises a plurality of analog-to-digital converters, and the plurality of analog-to-digital converters are electrically connected to at least one optical sensor of respective optical sensor arrays.

16. The optical encoder according to claim 13, wherein the sensing circuit comprises a plurality of comparators, and the plurality of comparators are electrically connected to each optical sensor of respective optical sensor arrays.

17. The optical encoder according to claim 13, wherein the encoding disk comprises an encoding code track part and an interpolating code track part, the optical detector comprises an encoding light sensing part corresponding to the encoding code track part and an interpolating light sensing part corresponding to the interpolating code track part, and the plurality of optical sensor arrays are located in the interpolating light sensing part.

18. The optical encoder according to claim 17, wherein the plurality of optical sensor arrays are arranged side by side in the interpolating light sensing part.

19. The optical encoder according to claim 17, wherein each of the plurality of optical sensor arrays is in a trapezoid shape, and short bases of the plurality of optical sensor arrays face the same direction.

20. The optical encoder according to claim 13, wherein a width of each of the plurality of optical sensor arrays corresponds to an interpolation period of the optical encoder.

* * * * *